United States Patent
Xia

[19]

[11] Patent Number: 6,053,123

[45] Date of Patent: Apr. 25, 2000

[54] PLASMA-ASSISTED METALLIC FILM DEPOSITION

[75] Inventor: Changfeng Xia, Plano, Tex.

[73] Assignee: Ball Semiconductor, Inc., Allen, Tex.

[21] Appl. No.: 09/069,645

[22] Filed: Apr. 29, 1998

[51] Int. Cl.[7] .................................................. H01L 33/00
[52] U.S. Cl. ..................................... 118/723 R; 438/584
[58] Field of Search .............................. 118/723 R, 620; 219/121.48; 438/758, 584

[56] References Cited

U.S. PATENT DOCUMENTS

| | | | |
|---|---|---|---|
| 4,741,286 | 5/1988 | Itoh et al. | 118/620 |
| 5,298,714 | 3/1994 | Szente et al. | 219/121.48 |

*Primary Examiner*—Bruce Breneman
*Assistant Examiner*—Allan Olsen
*Attorney, Agent, or Firm*—Haynes and Boone, LLP

[57] ABSTRACT

An apparatus and method for depositing thin films on the surface of a device such as a spherical shaped devices. The apparatus includes an enclosure containing a plurality of apertures and two chambers. The apertures connect to conduits for inputting and outputting the devices as well as injecting and releasing different gases and/or processing constituents. A first chamber is formed within the enclosure and includes a plasma torch. A second chamber is formed within the enclosure and includes a heating coil. Devices move through the input conduit and into the first chamber where they are heated by the plasma torch. Because of this heating, radicals, electrons, and ions near the surface of the devices are generated. The heated devices then move into the second chamber where they are further heated by energy from the conductor coil. At this time, the gases and/or processing constituents react with the heated device thereby growing a thin film on its outer surface.

19 Claims, 2 Drawing Sheets

PLASMA-ASSISTED METALLIC FILM DEPOSITION

BACKGROUND OF THE INVENTION

The invention relates generally to semiconductor integrated circuits, and more particularly, to an apparatus and method for fabricating a spherical-shaped semiconductor device.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

One processing step that is performed in the fabrication facility is to deposit a metal film on the surface of the chip. Because the surface may have both silicon (Si) and silica ($SiO_2$), a contact layer and a glue layer must first be deposited on the Si and $SiO_2$ surfaces. High vacuum sputtering is usually needed to firm the contact and glue layers. Once the contact and glue layers have been formed on the surfaces, the metal film can then be deposited. It is desirable, however, for the process of depositing a metal film on Si and $SiO_2$ surfaces to be simplified.

In co-pending U.S. patent application Ser. No. 08/858,004 filed on May 16, 1997, assigned to the same assignee as the present application and hereby incorporated by reference, a method and apparatus for manufacturing spherical-shaped semiconductor integrated circuit devices is disclosed. The present invention is specific to an apparatus and method for depositing metallic films on the surface of the spherical shaped devices using inductively coupled plasma.

SUMMARY OF THE INVENTION

The present invention, accordingly, provides an apparatus and method for depositing metallic films on the surface of a device such as a spherical shaped semiconductors. To this end, one embodiment provides an enclosure containing a plurality of apertures and two chambers. The apertures connect to conduits for inputting and outputting the devices as well as injecting and releasing different gases and/or processing constituents. A first chamber is formed within the enclosure and includes a plasma torch. A second chamber is formed within the enclosure and includes a heating coil.

Devices move through the input conduit and into the first chamber where they are heated by the plasma torch. Because of this heating, radicals, electrons, and/or ions (collectively radicals) near the surface of the devices are generated. In some embodiments, the processing constituents are included, which activates film deposition (growth) with the processing constituents on the devices' outer surface, which may include both silicon and silica. The heated devices then move into the second chamber where they are heated by energy from the conductor coil. At this time, the gases and/or processing constituents react with the heated device thereby further growing the thin film on its outer surface.

In one embodiment, the device moves through the chamber responsive to a process gas flowing in a direction opposite to the direction of the device. In this way, the speed of the device through the chamber can be controlled.

Several advantages result from the foregoing. For one, the process gases can treat the spheres in several manners including depositing a thin film on the spheres. Also, the spheres can be continuously introduced into the chamber to facilitate a pipeline production process. Further, the method of the present invention can be carried out in a relatively small space, thereby reducing or eliminating the need for a clean room environment.

DESCRIPTION OF THE PREFERRED EMBODIMENT

Figure 1:
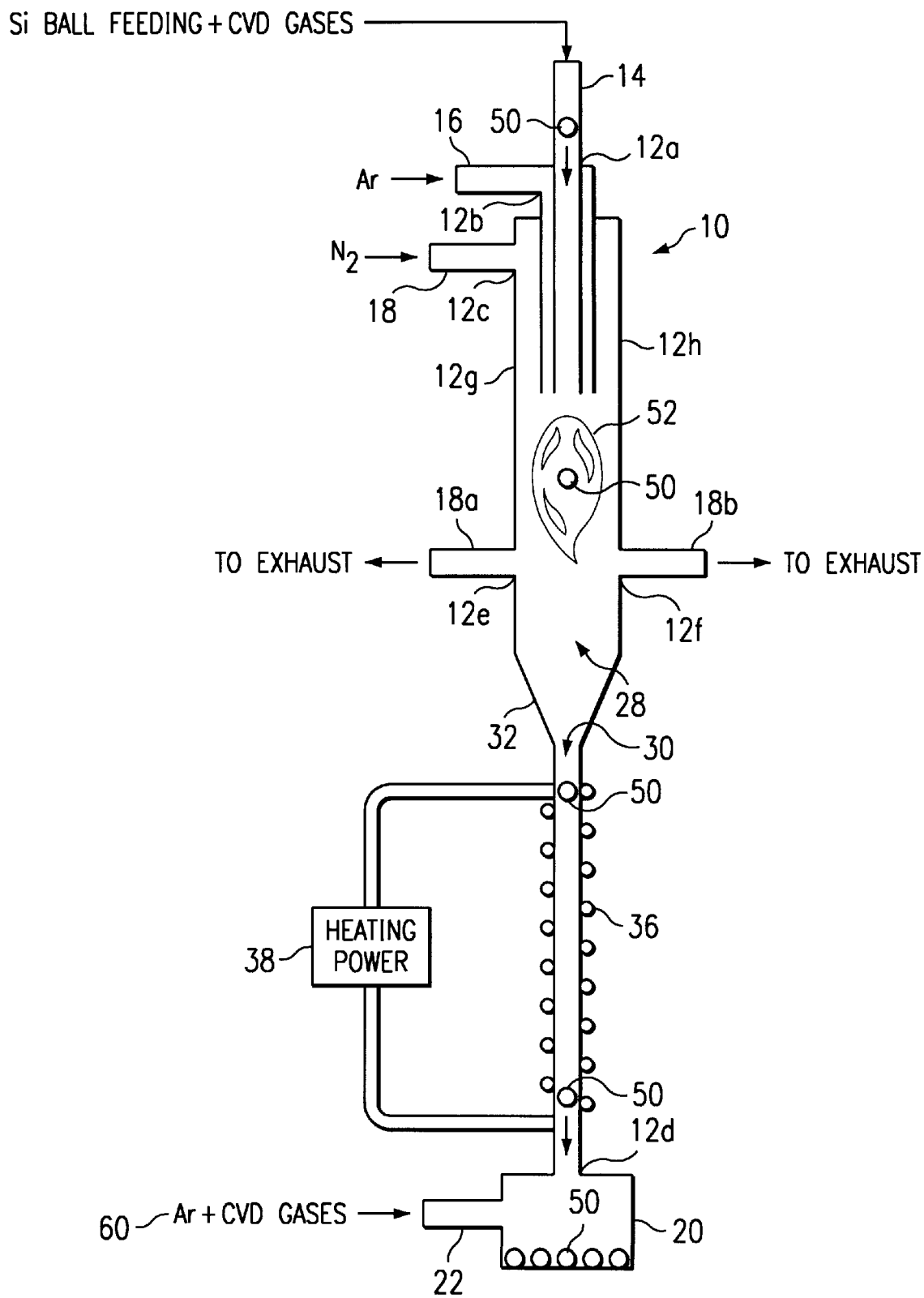
FIG. 1 illustrates a chemical vapor deposition processor according to one embodiment of the invention.

Referring to the FIG. 1, the reference numeral 10 designates, in general, one embodiment of a processor for growing a metallic film on a spherical shaped semiconductor device using chemical vapor deposition ("CVD"). Moreover, multiple processes, such as processing a consecutive sequence of devices, is possible by varying parameters described herein.

The processor 10 includes an enclosure 12 in the form of a hollow tube having three inlet openings 12a, 12b, 12c and three outlet openings 12d, 12e, 12f. The outlet opening 12d is located diametrically opposite the inlet opening 12a and also serves as an inlet opening for processing gases, which may include inert carrier gases and CVD gases. The inlet openings 12b, 12c are located near the inlet opening 12a and the outlet openings 12e, 12f are centrally located between the openings 12a, 12d.

One end of a vertically extending conduit 14 registers with the inlet opening 12a to allow a supply of devices to be introduced into the enclosure 12. Likewise, a conduit 16 registers with the inlet opening 12b to supply an inert gas (e.g. Argon) into the enclosure 12 and a conduit 18 registers with the inlet opening 12c to supply a cooling gas (e.g. Nitrogen) into the enclosure to cool down enclosure walls 12g, 12h. Two exhaust conduits 18a, 18b register with the openings 12e, 12f, respectively to allow exhaust fumes to be expelled from the enclosure 12. A receiver section 20 registers with the opening 12d and allows the devices received through the opening 12a to exit the enclosure 12. The receiver section 20 is further connected with a gas and materials conduit 22 for providing gases and/or other process constituents to the enclosure 12.

Imposed within the enclosure 12 is a plasma chamber 28 and a CVD chamber 30, each coaxial with the conduit 14, the openings 12a, 12d, and each other. A narrowing portion 32 defines the intersection between the two chambers 28, 30. The chamber 30 is also coaxial with a coiled electrical conductor 36 that surrounds the outer surface of the enclosure 12. The coil 36 is connected to a radio frequency ("RF") generator 38 for creating an RF current and producing RF heating energy inside the chamber 30. In an alternative embodiment, the generator 38 and coil 36 may provide resistance-type energy to the chamber 30.

In operation, a plurality of members 50, each of a semiconductor material, are introduced into the conduit 14. The members 50 are preferably of a generally spherical shape and could be of the same type formed according to the technique disclosed in the above-identified and presently incorporated patent application Ser. No. 08/858,004. The inert carrier gas from conduit 16 is included with the members 50 and serves to float the members throughout the conduit 14.

The heating gas flowing from the conduit 18 is heated by an external source (not shown). The external heating source may be, for example, a source of inductively coupled plasma (ICP). U.S. Patent Application No. (Atty. Docket No. 22397.61), filed Mar. 2, 1998 and which is herein incorporated by reference, describes a plasma torch 52 that may be used for heating the gas. The heated gas and the plasma torch 52 heat the center of the plasma chamber 28 to over 1000° C.

The members 50 exit the conduit 14 at the opening 12a and descend down (as shown in the figure) towards the plasma chamber 28. In an alternative embodiment, as the members 50 pass through the conduit 14, they are preheated by a resistance-type furnace (not shown). Once the members 50 enter the plasma chamber 28, they are heated to about 1000° C. Normally, the members 50 will be spinning due to rotating momentum. After traversing the interior of the plasma chamber 28, the members 50 pass through the narrowing portion 32 and into the CVD chamber 30.

During this flow of the members 50 through the CVD chamber 30, one or more gases, including chemical vapor deposition constituents (collectively CVD precursors 60), are introduced from the gas and materials conduit 22, through the receiver 20, and into the CVD chamber 30. In another embodiment, a carrier gas may be included with the CVD precursors 60. The carrier gas serves to float the members 50 towards the receiver 24, thereby controlling the rate of descent of the members through the chamber 30.

During the passage of the carrier gas and CVD precursors 60 through the CVD chamber 30, the coil 36 is activated by the RF generator 38. The coil 36 thereby applies the RF energy to the members 50. The RF energy is concentrated in the center of the enclosure 12 and hence the center of the CVD chamber 30. As a result, the enclosure 12 is not heated to a great extent and, in another embodiment, may be further cooled by cooling gas (not shown). The RF generator 38 produces the RF energy at a relatively high temperature (about 100–700° C., depending on the material being deposited). It is understood that this temperature does not generate ICP.

The CVD chamber 30 now includes the CVD precursors 60, the high amount of RF energy, and the plurality of members 50 moving therethrough. The CVD precursors 60, in combination with the RF energy from the coil 36, grow a metallic film on the outer surface of the members 50. The prior plasma heating of the members 50 facilitates the CVD process, as discussed in greater detail below. The deposition rate can be controlled by the RF energy from the coil 36 and the descent rate of the members 50.

The members 50 then exit the CVD chamber 30 and are received by the receiver 24. The introduction and discharge of the members 50 in this manner is controlled to prevent the accumulation of a relatively large number of members in the CVD chamber 30 at the same time.

Figure 2A:
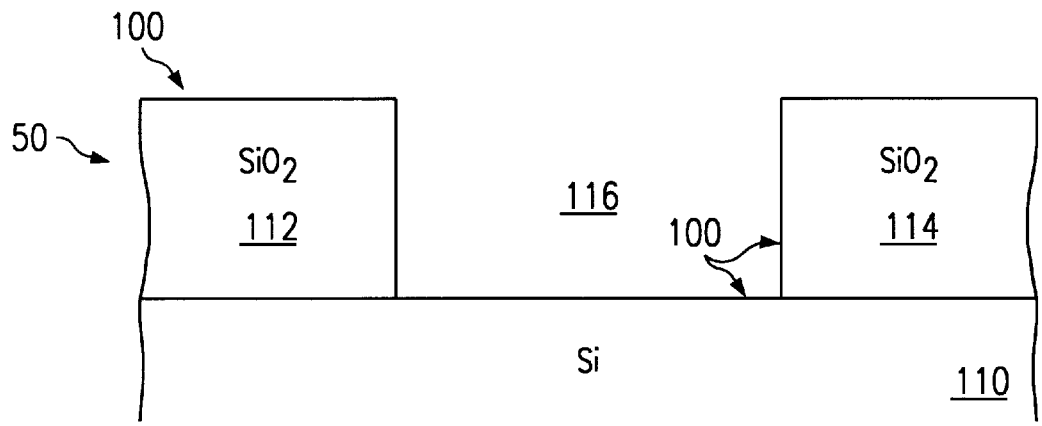
FIGS. 2a, 2b and 2c provide cross-sectional views of a portion of a device as it progresses through the processor of FIG. 1.
Figure 2B:
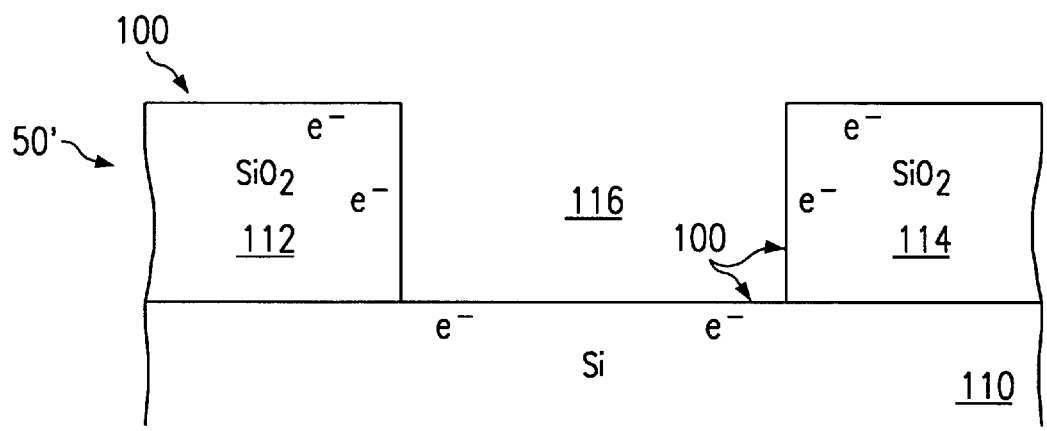
Figure 2C:
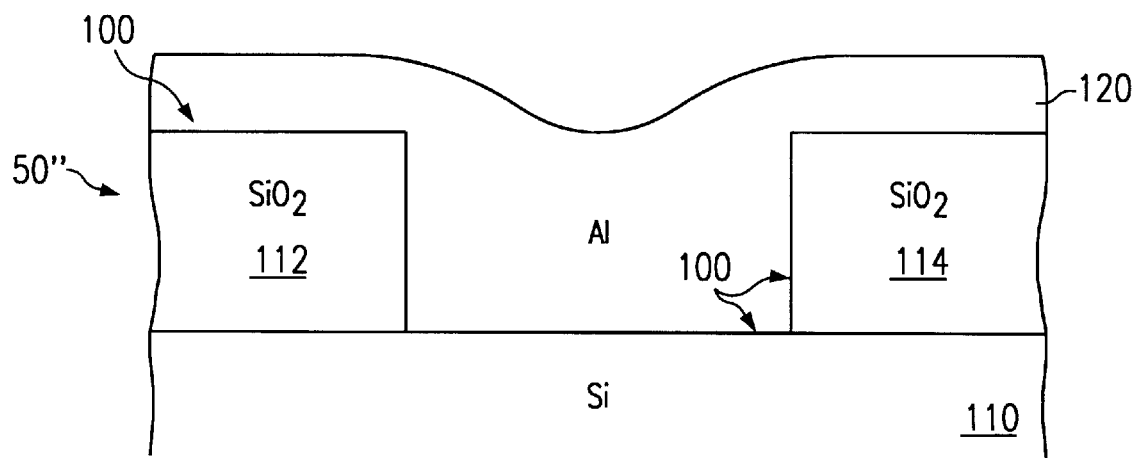

FIGS. 2a, 2b, and 2c illustrate an exemplary surface 100 of a member 50 as it moves through the processor 10. Referring to FIG. 2a, before the member 50 enters the processor 10, the surface 100 collectively includes surfaces of a Si substrate 110 and several $SiO_2$ structures 112, 114. The surface 100 has already gone through an etching process so that the $SiO_2$ structures 112, 114 form a contact area 116 therebetween so that the Si layer 110 is exposed. It is desired to form a metal layer on top of the surface 100 (as viewed from FIG. 2a) so that the metal layer also fills the contact area 116. It is understood that the illustrated surface 100 is simplified for the sake of clarity, and that additional and/or different structures may be formed thereon.

In conventional processing, a metal layer such as Aluminum (Al) is not deposited on the surface 100 until the surface goes through several preprocess operations. For example, the preprocessing operations would require forming a glue layer (e.g., TiN) on the surface 100 over the $SiO_2$ structures 112, 114. This is because the surface of the $SiO_2$ structures 112, 114 may need much longer nucleation time than the surface of the Si structure 110. present invention eliminates this requirement, becasue the ICP torch 52 generates a high concentration of electrons, radicals, and ions, which facilitate film growth on both surfaces, as further described below.

Referring to FIG. 2b, the member (now designated as member 50') has entered the plasma chamber 28 and is heated by the plasma torch 52. Due to the extreme amount of heat, a large number of radicals, electrons, and/or ions (collectively "radicals" and designated as electrons e in FIG. 2b) gather over the entire surface 100, including the $SiO_2$ structures 112, 114. The radicals are highly active and easily activate surface reaction with the metal layer to be deposited.

Referring to FIG. 2c, the member (now designated as member 50") has entered the CVD chamber 30 and is heated by the conducting coils 36. At the same time, the CVD precursors 60 facilitate the chemical reaction of the metal (e.g., Al) with the surface 100 to form a metal layer 120. Due to the existence of the activated radicals described above, the metal layer 120 properly adheres to the entire surface 100, including the $SiO_2$ structures 112, 114.

It is understood that several variations may be made in the foregoing. For example, the invention is not limited to the specific orientation of the various inlet and outlet conduits relative to the processor 10 described above. Thus the members 50 and the gases can travel in a direction through the chambers 28 and/or 30 other than a vertical and horizontal direction, respectively, as described above. Also the shape of the chambers 28 and/or 30 can be changed to facilitate different requirements. Other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for processing a semiconductor device, the apparatus comprising:

an enclosure containing an input aperture and an output aperture;

first and second chambers defined within the enclosure, the second chamber containing a plurality of chemical precursors;

a plasma torch for supplying a first heat to the first chamber; and a heater for suppling a second heat to the second chamber;

wherein the semiconductor device is allowed to move through the input aperture, into the first chamber, into the second chamber, and then through the output aperture, and wherein the first heat activates radicals on a surface of the semiconductor device to prepare for a deposition process and the second heat is used to facilitate the deposition process with the chemical precursors.

2. The apparatus of claim 1 further comprising:

a chemical inlet registering with the second chamber for supplying the chemical precursors.

3. The apparatus of claim 1 further comprising:

a process gas inlet registering with the second chamber for controlling the rate of movement of the semiconductor device through the second chamber.

4. The apparatus of claim 3 wherein the rate at which the semiconductor device moves through the chamber is controlled by gravity and by a gas from the process gas inlet.

5. The apparatus of claim 1 further comprising:

a materials inlet registering with the second chamber for providing a gas to control the movement of the semiconductor device through the second chamber and for supplying the chemical precursors.

6. The apparatus of claim 1 further comprising an exhaust outlet registering with the enclosure for receiving and discharging exhaust fumes.

7. The apparatus of claim 1 wherein the heater surrounds the enclosure.

8. The apparatus of claim 1 wherein the heater is a resistance-type furnace.

9. The apparatus of claim 1 wherein the heater includes a conductor coil for supplying radio frequency energy.

10. The apparatus of claim 1 wherein the deposition process is chemical vapor deposition ("CVD") and the chemical precursor include metallic elements.

11. The apparatus of claim 1 wherein the semiconductor device is substantially spherical in shape, and the deposition process grows a film on the outer surface of the device.

12. A process tube for performing chemical vapor deposition on a sequence of spherical shaped semiconductor devices, the tube comprising:

a plasma generator for producing a plasma torch;

a first chamber surrounding the plasma torch and inside the process tube;

a conductor coil electrically connected to a radio frequency (RF) energy generator;

a second chamber coaxial with the conductor coil and inside the process tube;

a first conduit registering with a first opening in the process tube for inputting the semiconductor devices into the process tube;

a second conduit registering with a second opening in the process tube for outputting the semiconductor devices from the process tube;

means for inserting chemicals into the second chamber;

wherein, the devices may pass from the first conduit into the first chamber where they are heated by the plasma torch to activate radicals near the surface of the devices, and then may pass to the second chamber where they are further heated by RF energy from the conductor coil and react with the inserted chemicals.

13. The process tube of claim 12 wherein the second conduit inserts a process gas into the second chamber to affect the movement of the semiconductor devices through the second chamber.

14. The process tube of claim 12 wherein the first conduit inserts a process gas into the chamber to initiate the chemical vapor deposition on the semiconductor devices.

15. The process tube of claim 12 wherein the conductor coil is outside of the process tube.

16. The process tube of claim 12 wherein the semiconductor devices move through the second chamber at a controlled rate.

17. The process tube of claim 12 wherein the means for inserting chemicals utilizes the second conduit.

18. A method for performing chemical vapor deposition on a sequence of spherical shaped semiconductor devices, the method comprising:

sequentially providing the semiconductor devices through a first opening in a process tube;

sequentially heating the semiconductor devices to a first temperature so that radicals near the surfaces of each of the devices are activated;

sequentially directing the semiconductor devices with activated radicals to a chamber coaxial with a conductor coil electrically connected to a radio frequency (RF) energy generator;

sequentially heating each of the semiconductor devices with RF energy from the conductor coil;

providing chemicals into the chamber for deposition on the surface of each of the semiconductor devices;

sequentially outputting the semiconductor devices from the chamber and the process tube.

19. The method of claim 18 further comprising:

controlling the movement of the semiconductor devices through the chamber.

* * * * *